US011718418B2

(12) United States Patent
Brown et al.

(10) Patent No.: US 11,718,418 B2
(45) Date of Patent: Aug. 8, 2023

(54) DETERMINING SERVICABILITY AND REMAINING LIFE OF AN IN-SERVICE STRUCTURE USING THREE-DIMENSIONAL SCAN DATA

(71) Applicant: The Boeing Company, Chicago, IL (US)

(72) Inventors: Thomas A. Brown, O'Fallon, MO (US); Craig Martin Farniok, Godfrey, IL (US); Todd Roffo, Middleburg, FL (US); Nicholas E. Smith, Jacksonville, FL (US); Jacob Paul Thilges, University City, MO (US)

(73) Assignee: THE BOEING COMPANY, Chicago, IL (US)

( * ) Notice: Subject to any disclaimer, the term of this patent is extended or adjusted under 35 U.S.C. 154(b) by 1083 days.

(21) Appl. No.: 16/402,656

(22) Filed: May 3, 2019

(65) Prior Publication Data

US 2020/0346786 A1 Nov. 5, 2020

(51) Int. Cl.
| | |
|---|---|
| B64F 5/60 | (2017.01) |
| G06F 30/15 | (2020.01) |
| G05B 23/02 | (2006.01) |
| G06T 15/08 | (2011.01) |
| G06T 17/20 | (2006.01) |

(52) U.S. Cl.
CPC ............ *B64F 5/60* (2017.01); *G05B 23/0283* (2013.01); *G06F 30/15* (2020.01); *G06T 15/08* (2013.01); *G06T 17/20* (2013.01)

(58) Field of Classification Search
None
See application file for complete search history.

(56) References Cited

U.S. PATENT DOCUMENTS

| | | | |
|---|---|---|---|
| 10,930,069 B1 * | 2/2021 | Jackson | .................. G06T 17/20 |
| 2008/0036755 A1 | 2/2008 | Bae et al. | |
| 2017/0068756 A1 * | 3/2017 | Wilsher | .................. G06F 30/18 |
| 2018/0002039 A1 * | 1/2018 | Finn | ...................... G07C 5/0808 |
| 2018/0372486 A1 | 12/2018 | Farniok et al. | |
| 2019/0156472 A1 * | 5/2019 | Link | ......................... G06T 7/75 |

FOREIGN PATENT DOCUMENTS

| | | |
|---|---|---|
| DE | 10212337 A1 | 12/2002 |
| JP | 2017167808 A | 9/2017 |

OTHER PUBLICATIONS

Dassault Systemes SolidWorks Online Help for SolidWorks 2016 Version (Year: 2016).*

(Continued)

*Primary Examiner* — James J Lee
*Assistant Examiner* — David Hatch
(74) *Attorney, Agent, or Firm* — Sage Patent Group

(57) ABSTRACT

According to an embodiment, three-dimensional (3D) scan data representative of an in-service structure that is captured by a scanning device is accessed by a processor circuit. Based on the 3D scan data, in-service computer-aided design (CAD) data representative of an in-service surface corresponding to the in-service structure is generated by the processor circuit. Based on the in-service CAD data representative of the in-service surface, at least one of a serviceability level or remaining life estimate of the in-service structure is determined.

20 Claims, 8 Drawing Sheets

(56) References Cited

OTHER PUBLICATIONS

Creaform "Scan to Cad an Essential Part of Product Development" (Year: 2018).*
3D Printing Industry "iPad 3d Scanning Puts Modelling and Design in the Hands of the Masses" (Year: 2016).*
Extended European Search Report dated Oct. 2, 2020 for European Patent Application No. 20169703.5, 7 pages.
Ristic, Mihailo et al., "Measurement-based upding of turbine blade CAD models: a case study," International Journal of Computer Integrated Manufacturing, vol. 17, No. 4, Jun. 1, 2004, pp. 352-363.
Liu, Jong-Shang, et al., "Aerodynamic and Mechanical Analyses on Manufacturing Variations of a Turbine Blade Row," Proceedings of ASME Turbo Expo 2018: Turbomachinery Technical Conference and Exposition, Oslo, Norway, Jun. 11-15, 2018, 11 pages.
Rajesh, H. et al., "LCV Chassis Frame Optimization Using Combined Simulation and Experimental Approach," SAE Technical Paper 2017-26-0289, Konferenzbeitrag, "IBEC 2003," Und SAE Technical Paper Series, vol. 1, Jan. 18, 2017, 11 pages.
Examiner's Report for Canadian Patent Application No. 3,073,249, dated Mar. 10, 2023, 6 pages.

\* cited by examiner

100

ACCESSING NOMINAL CAD DATA REPRESENTATIVE OF A NOMINAL VOLUME INCLUDING A NOMINAL SURFACE, THE NOMINAL VOLUME CORRESPONDING TO A NOMINAL STRUCTURE
102

ACCESSING THREE-DIMENSIONAL (3D) SCAN DATA SUCH AS A 3D MESH DATA STRUCTURE CAPTURED BY A SCANNING DEVICE REPRESENTATIVE OF AN IN-SERVICE STRUCTURE CORRESPONDING TO A PORTION OF THE NOMINAL STRUCTURE
104

BASED ON THE 3D SCAN DATA, GENERATING IN-SERVICE CAD DATA REPRESENTATIVE OF AN IN-SERVICE SURFACE CORRESPONDING TO THE IN-SERVICE STRUCTURE, SUCH AS BY CONVERTING THE 3D MESH DATA STRUCTURE INTO AN IN-SERVICE CAD DATA STRUCTURE
106

MODIFYING THE NOMINAL CAD DATA BASED ON THE IN-SERVICE CAD DATA
108

REPLACING A PORTION OF THE NOMINAL SURFACE CORRESPONDING TO THE PORTION OF THE NOMINAL STRUCTURE WITH THE IN-SERVICE SURFACE TO GENERATE MODIFIED NOMINAL CAD DATA
110

DETERMINING AT LEAST ONE OF A SERVICEABILITY LEVEL OR REMAINING LIFE ESTIMATE OF THE IN-SERVICE STRUCTURE BASED ON THE IN-SERVICE CAD DATA REPRESENTATIVE OF THE IN-SERVICE SURFACE
112

STORING THE MODIFIED NOMINAL CAD DATA IN A MEMORY
113

PERFORMING STRENGTH ANALYSIS USING THE MODIFIED NOMINAL CAD DATA
114

FIG. 1A

DETERMINING SERVICABILITY AND REMAINING LIFE OF AN IN-SERVICE STRUCTURE USING THREE-DIMENSIONAL SCAN DATA

FIELD

Embodiments described herein relate to analyzing an in-service structure, and more particularly to determining serviceability and remaining life of an in-service structure using three-dimensional scan data.

BACKGROUND

During structural inspection and maintenance of aircraft, aircraft components are inspected, measured, and compared to pre-determined (e.g., original or as-designed) allowable limits, such as design tolerances. For example, a component is measured by hand by a maintenance technician using measuring tools (e.g., calipers, micrometers, scales, hull gauges, etc.). The measurements are compared to design tolerances (e.g., design tolerances indicated by 3D models or 2D blueprints) of the component. If the measurements are not within the design tolerances, the measurements are sent to structural engineers (who may be offsite) for analysis. The analysis may indicate that the component is to be reused, repaired, or scrapped. Additionally, because of the complexity of the analysis, the structural engineers may request more measurements to complete the analysis, which extends the inspection and maintenance cycle time. This structural inspection and maintenance process is time consuming and enables little to no reuse of the complex analysis done for the component or for similar components of the same type.

SUMMARY

In accordance with an embodiment, a system for determining serviceability and remaining life of an in-service structure is disclosed. The system includes a processor circuit and a memory coupled to the processor circuit. The memory includes machine-readable instructions that, when executed by the processor circuit access three-dimensional (3D) scan data captured by a scanning device representative of an in-service structure. The machine-readable instructions further cause the processor circuit to, based on the 3D scan data, generate in-service Computer-Aided Design (CAD) data representative of an in-service surface corresponding to the in-service structure. The machine-readable instructions further cause the processor circuit to determine at least one of a serviceability level or remaining life estimate of the in-service structure based on the in-service CAD data representative of the in-service surface.

In accordance with an embodiment and any of the preceding embodiments, the machine-readable instructions further cause the processor circuit to access nominal CAD data representative of a nominal volume comprising a nominal surface, wherein the nominal volume corresponds to a nominal structure, and wherein a portion of the nominal surface corresponds to the in-service surface. The machine-readable instructions further cause the processor circuit to replace the portion of the nominal surface with the in-service surface to generate modified nominal CAD data representative of a modified nominal volume comprising the in-service surface. Determining the at least one of the serviceability level or remaining life estimate of the in-service structure is further based on the modified nominal CAD data.

In accordance with an embodiment and any of the preceding embodiments, replacing the portion of the nominal surface further comprises removing a trim volume defined by the portion of the nominal surface and the in-service surface from the nominal volume.

In accordance with an embodiment and any of the preceding embodiments, replacing the portion of the nominal surface further comprises adding an additive volume defined by the portion of the nominal surface and the in-service surface to the nominal volume.

In accordance with an embodiment and any of the preceding embodiments, replacing the portion of the nominal surface further comprises raising the nominal surface with respect to the nominal volume to generate an enlarged nominal volume, and removing a trim volume defined by the raised nominal surface and the in-service surface from the enlarged nominal volume.

In accordance with an embodiment and any of the preceding embodiments, the machine-readable instructions further cause the processor circuit to compare the in-service surface of the modified nominal volume to the 3D scan data. The machine-readable instructions further cause the processor circuit to determine, based on the comparing, whether the in-service surface of the modified nominal CAD data corresponds to the in-service surface of the in-service structure within a predetermined tolerance. The machine-readable instructions further cause the processor circuit to generate, in response to the determining, an indication of whether the in-service surface of the modified nominal CAD data corresponds to the in-service surface of the in-service structure within the predetermined tolerance.

In accordance with an embodiment and any of the preceding embodiments, the machine-readable instructions further cause the processor circuit to access second 3D scan data captured by the scanning device representative of the in-service structure. The machine-readable instructions further cause the processor circuit to compare the in-service surface of the modified nominal CAD data to the second 3D scan data. The machine-readable instructions further cause the processor circuit to determine, based on the comparing, whether the in-service surface of the modified nominal CAD data corresponds to the in-service surface of the in-service structure within a predetermined tolerance. The machine-readable instructions further cause the processor circuit to generate, in response to the determining, an indication of whether the in-service surface of the modified nominal CAD data corresponds to the in-service surface of the in-service structure within the predetermined tolerance.

In accordance with an embodiment and any of the preceding embodiments, the 3D scan data comprises a 3D mesh data structure. Generating the in-service CAD data further comprises converting the 3D mesh data structure into an in-service CAD data structure comprising the in-service surface.

In accordance with an embodiment and any of the preceding embodiments, determining the at least one of the serviceability level or remaining life estimate of the in-service structure based on the in-service CAD data further comprises performing strength analysis on the in-service CAD data.

In accordance with an embodiment and any of the preceding embodiments, performing strength analysis comprises performing finite element analysis (FEA) to determine the condition of the in-service structure.

In accordance with an embodiment and any of the preceding embodiments, the in-service structure comprises an in-service vehicle structure.

In accordance with an embodiment and any of the preceding embodiments, the in-service vehicle structure comprises an in-service aircraft structure.

In accordance with an embodiment and any of the preceding embodiments, a method for determining serviceability and remaining life of an in-service structure is disclosed. The method includes accessing, by a processor circuit, three-dimensional (3D) scan data captured by a scanning device representative of an in-service structure. The method further includes, based on the 3D scan data, generating, by the processor circuit, in-service CAD data representative of an in-service surface corresponding to the in-service structure. The method further includes determining at least one of a serviceability level or remaining life estimate of the in-service structure based on the in-service CAD data representative of the in-service surface.

In accordance with an embodiment and any of the preceding embodiments, the method further includes accessing nominal CAD data representative of a nominal volume comprising a nominal surface, wherein the nominal volume corresponds to a nominal structure, and wherein a portion of the nominal surface corresponds to the in-service surface. The method further includes replacing the portion of the nominal surface with the in-service surface to generate modified nominal CAD data representative of a modified nominal volume comprising the in-service surface. Determining the at least one of the serviceability level or remaining life estimate of the in-service structure is further based on the modified nominal CAD data.

In accordance with an embodiment and any of the preceding embodiments, replacing the portion of the nominal surface further comprises removing a trim volume defined by the portion of the nominal surface and the in-service surface from the nominal volume.

In accordance with an embodiment and any of the preceding embodiments, replacing the portion of the nominal surface further comprises adding an additive volume defined by the portion of the nominal surface and the in-service surface to the nominal volume.

In accordance with an embodiment and any of the preceding embodiments, replacing the portion of the nominal surface further comprises raising the nominal surface with respect to the nominal volume to generate an enlarged nominal volume, and removing a trim volume defined by the raised nominal surface and the in-service surface from the enlarged nominal volume.

In accordance with an embodiment and any of the preceding embodiments, the method further includes comparing, by the processor circuit, the in-service surface of the modified nominal volume to the 3D scan data. The method further includes determining, by the processor circuit based on the comparing, whether the in-service surface of the modified nominal CAD data corresponds to the in-service surface of the in-service structure within a predetermined tolerance. The method further includes generating, by the processor circuit in response to the determining, an indication of whether the in-service surface of the modified nominal CAD data corresponds to the in-service surface of the in-service structure within the predetermined tolerance.

In accordance with an embodiment and any of the preceding embodiments, the method further includes performing strength analysis on the modified nominal CAD data to determine a condition of the in-service structure.

In accordance with an embodiment and any of the preceding embodiments, a system for determining serviceability and remaining life of an in-service structure is disclosed. The system includes a processor circuit and a memory coupled to the processor circuit. The memory includes machine-readable instructions that, when executed by the processor circuit, access nominal CAD data representative of a nominal volume comprising a nominal surface, wherein the nominal volume corresponds to a nominal structure. The machine-readable instructions further cause the processor circuit to access three-dimensional (3D) scan data captured by a scanning device representative of an in-service structure corresponding to a portion of the nominal structure. The machine-readable instructions further cause the processor circuit to, based on the 3D scan data, generate in-service CAD data representative of an in-service surface of the in-service structure corresponding to a portion of the nominal surface. The machine-readable instructions further cause the processor circuit to replace the portion of the nominal surface with the in-service surface to generate modified nominal CAD data representative of a modified nominal volume comprising the in-service surface.

BRIEF DESCRIPTION OF THE DRAWINGS

FIG. 1A is a flowchart of operations for generating computer-aided design (CAD) data for strength analysis of an in-service component, according to an embodiment;

DETAILED DESCRIPTION

Figure 1B:
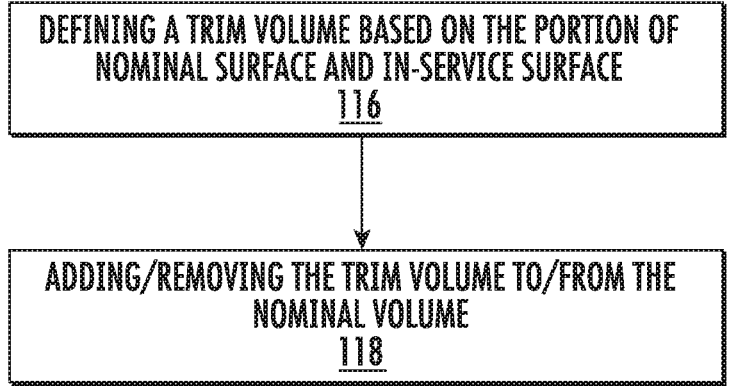
FIG. 1B is a flowchart of operations for replacing a portion of a nominal surface with an in-service surface, including adding or removing a volume defined by a portion of a nominal surface and an in-service surface from a nominal volume, according to an embodiment.

Embodiments described herein relate to analyzing an in-service structure, and more particularly to determining serviceability and remaining life of an in-service structure using three-dimensional scan data. According to some embodiments, three-dimensional (3D) scan data representative of an in-service structure, such as a vehicle (e.g., aircraft) or other structure, is captured by a scanning device. Based on the 3D scan data, in-service computer-aided design (CAD) data representative of an in-service surface corresponding to the in-service structure is generated. Based on the in-service CAD data at least one of a serviceability level or remaining life estimate of the in-service structure is determined. For example, in some embodiments, nominal CAD data is accessed, which is representative of a nominal volume having a nominal surface. The nominal volume corresponds to a nominal structure, and a portion of the nominal surface corresponds to the in-service surface. In this example, the portion of the nominal surface is replaced with the in-service surface to generate modified nominal CAD data, which is representative of a modified nominal volume having the in-service surface. In this example, determining the at least one of the serviceability level or remaining life estimate of the in-service structure is further based on the modified nominal CAD data.

One advantage of this and other arrangements is that models used to perform strength analysis on in service conditions, such as finite element analysis (FEA) models, may be created more quickly and efficiently as compared to existing methods, such as manual measurement and gridding, for example. Instead of taking measurements and creating and modifying CAD models (such as FEA meshes for example) by hand, high definition scans may generate 3D surfaces that more closely represent the in service condition of and can be used to generate the CAD models for FEA analysis, which may remove multiple hours from the measurement and generation cycle, and which may increase accuracy for the resultant FEA analysis over conventional methods.

In this regard, FIG. 1A is a flowchart of operations 100 for generating CAD data for strength analysis of an in-service component, according to an embodiment. The operations 100 include accessing nominal CAD data representative of a nominal volume including a nominal surface, which corresponds to a nominal structure (Block 102). In one example, the nominal structure is an aircraft or other vehicle structure design. The operations 100 further include accessing 3D scan data captured by a scanning device (Block 104). The 3D scan data is representative of an in-service structure corresponding to a portion of the nominal structure. In an aircraft example, the in-service structure is an in-service example of the aircraft corresponding to the nominal aircraft design. The operations 100 further include, based on the 3D scan data, generating in-service CAD data representative of an in-service surface corresponding to the in-service structure (Block 106). In some examples, the 3D scan data includes a 3D mesh data structure, and generating the in-service CAD data further includes converting the 3D mesh data structure into an in-service CAD data structure including the in-service surface.

In some examples, the in-service surface includes wear or damage that causes the in-service surface to deviate from the corresponding nominal surface of the nominal structure. The operations 100 further include modifying the nominal CAD data based on the in-service CAD data (Block 108). In one example, this includes replacing a portion of the nominal surface of the nominal CAD data with the in-service surface of the in-service CAD data to generate modified nominal CAD data (Block 110). The portion of the nominal surface of the nominal CAD data corresponds to the portion of the nominal structure defined above. The operations 100 further include determining at least one of a serviceability level or remaining life estimate of the in-service structure based on the in-service CAD data representative of the in-service surface (Block 112). In some examples, this determination includes storing the modified nominal CAD data in a memory (Block 113) and performing strength analysis (such as FEA strength analysis, for example) using the modified nominal CAD data (Block 114). For example, the modified nominal CAD data may be analyzed using FEA strength analysis to produce an FEA result corresponding to at least one of the actual condition or serviceability of the in-service structure, within predetermined tolerances.

FIG. 1B is a flowchart of operations 110' for one example of replacing a portion of a nominal surface with an in-service surface, as an alternative to Block 110 of FIG. 1. The operations 110' include defining a trim volume based on the portion of the nominal surface and in-service surface (Block 116). In one example, defining the trim volume includes defining positioning the nominal surface and the in-service surface in a common coordinate system, and defining the trim volume as the volume between the nominal surface and the in-service surface in one or more dimensions of the coordinate system. The operations 110' further include adding or removing the trim volume from the nominal volume (Block 118) to generate the modified nominal CAD data. In embodiments where the trim volume is added to the nominal volume, the trim volume may alternatively be referred to as an additive volume.

Figure 1C:
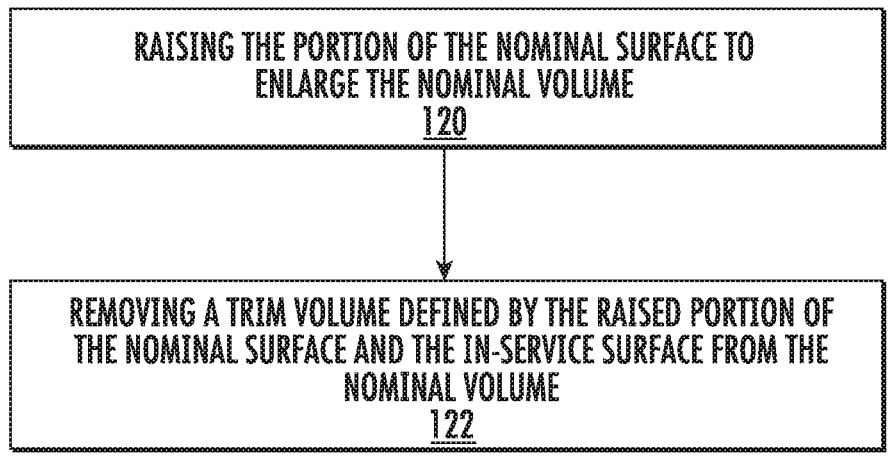
FIG. 1C is a flowchart of operations for replacing a portion of a nominal surface with an in-service surface, including removing a volume defined by a raised portion of a nominal surface and an in-service surface from an enlarged nominal volume, according to an alternative embodiment.

FIG. 1C is a flowchart of operations 110" for another example of replacing a portion of a nominal surface with an in-service surface, as another alternative to Block 110 of FIG. 1. The operations 110" include raising the portion of the nominal surface to enlarge the nominal volume (Block 120). The operations 110" further include removing a trim volume defined by the raised portion of the nominal surface and the in-service surface from the nominal volume (Block 122).

Figure 1D:
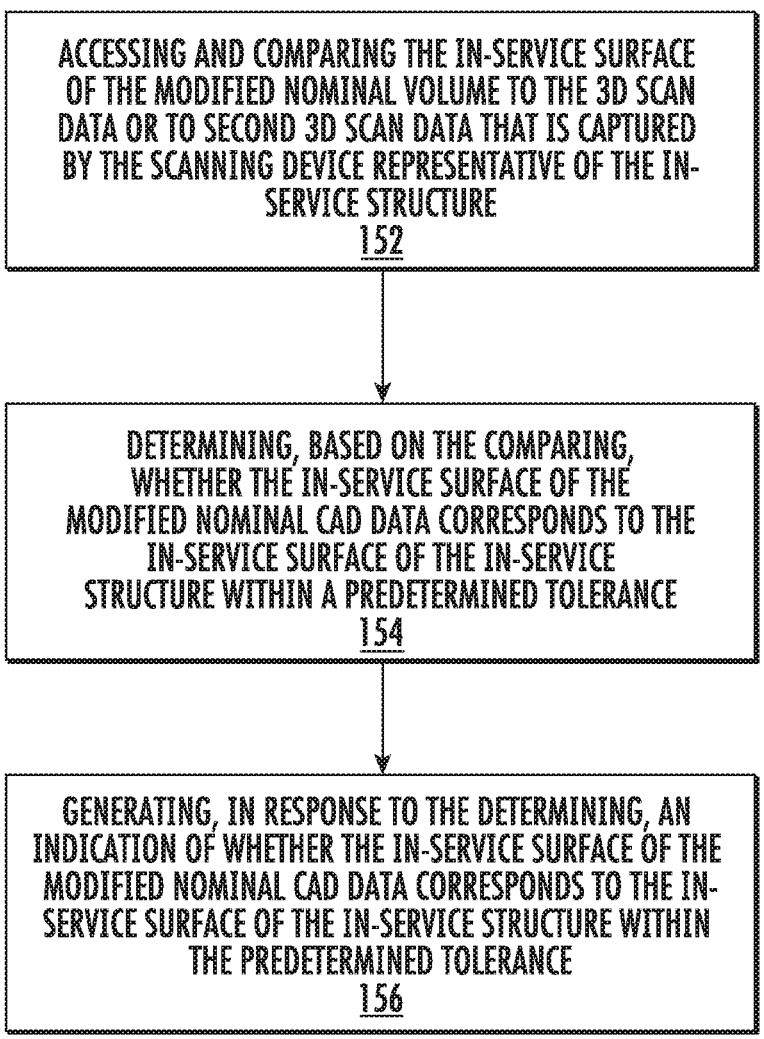
FIG. 1D is a flowchart of operations 150 for verifying the accuracy and precision of the modified nominal volume, according to an embodiment.

FIG. 1D is a flowchart of operations 150 for verifying the accuracy and precision of the modified nominal volume, according to an embodiment. The operations 150 include accessing and comparing the in-service surface of the modified nominal volume to the 3D scan data or to second 3D scan data that is captured by the scanning device representative of the in-service structure (Block 152). The operations 150 further include determining, based on the comparing, whether the in-service surface of the modified nominal CAD data corresponds to the in-service surface of the in-service structure within a predetermined tolerance (Block 154). The operations 150 further include generating, in response to the determining, an indication of whether the in-service surface of the modified nominal CAD data corresponds to the in-service surface of the in-service structure within the predetermined tolerance (Block 156).

Referring now to FIGS. 2A-2D, FIG. 2A illustrates capturing 3D scan data of an in-service structure 200 by an image capture device 202, according to an embodiment. In this embodiment, the in-service structure 200 is an in-service aircraft structure, e.g., an aircraft component, having real-world dimensions, i.e., depth (x) 204, length (y) 206, and height (z) 208 dimensions. It should be understood, however, that the in-service structure 200 may be another type of in-service vehicle structure, or other structure, as desired. The in-service structure 200 in this example has a number of physical damage features 210, which may result from wear or damage to the in-service structure 200. These damage features 210 cause the dimensions of the in-service structure 200 to deviate from the original design or original condition of the in-service structure 200. As discussed above, conventional manual measurement methods, such as by using hand-measurement tools, gridding, etc., are time consuming and may not produce measurements with acceptable accuracy or precision for strength analysis or other types of analysis for determining at least one of the serviceability or remaining life for the in-service structure 200.

Figures 2A, 2B:
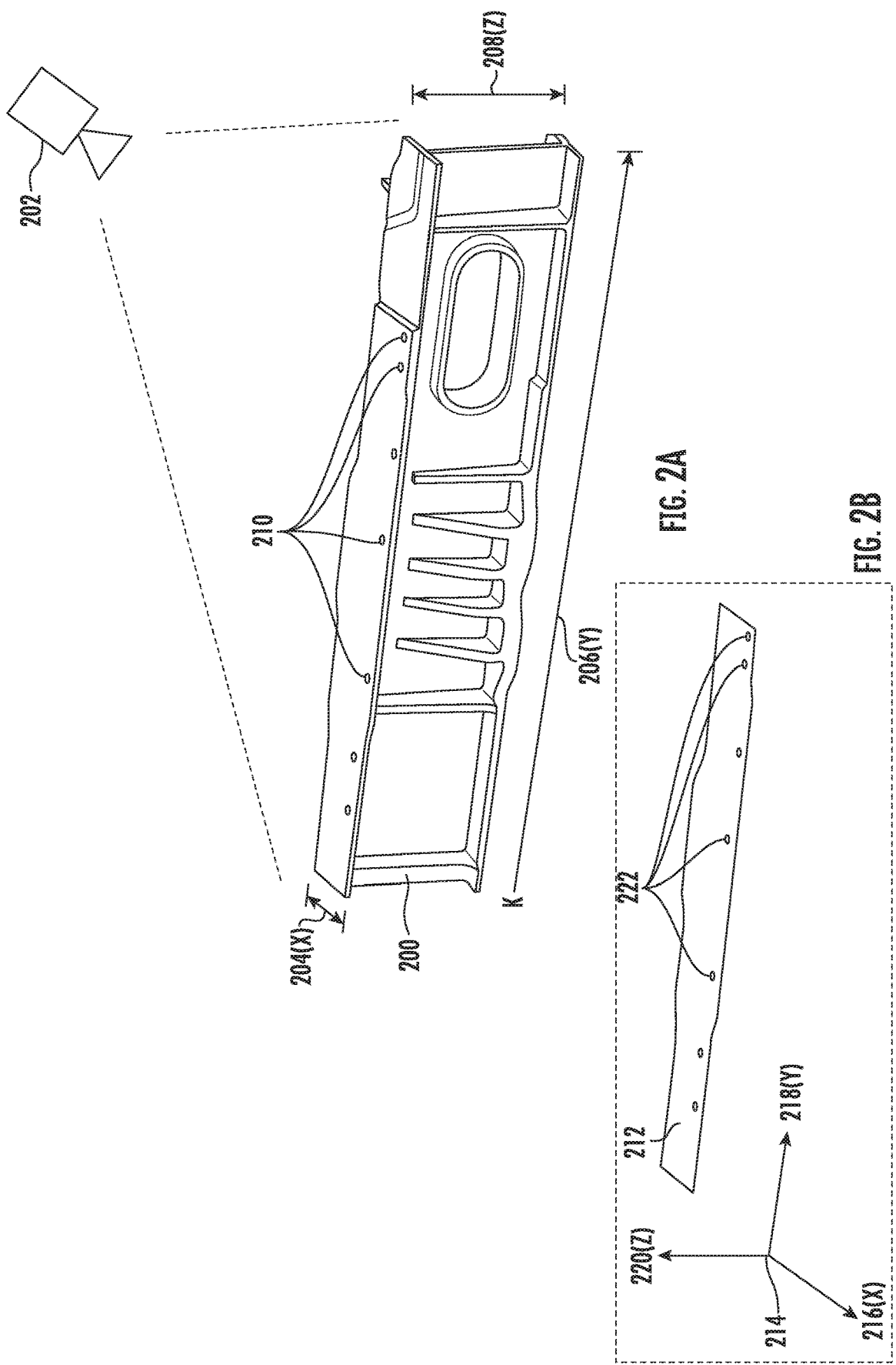
FIG. 2A illustrates capturing 3D scan data of an in-service structure by a scanning device, according to an embodiment.
FIG. 2B illustrates generating in-service CAD data from the 3D scan data captured in FIG. 2A, according to an embodiment.

Referring now to FIG. 2B, the 3D scan data of the in-service structure 200 of FIG. 2A is used to generate in-service CAD data. The 3D scan data shown by FIG. 2B includes an in-service surface 212 positioned and oriented within a scanner coordinate system 214. In this example, the scanner coordinate system 214 is a cartesian coordinate system having depth (x) 216, length (y) 218, and height (z) 220 dimensions, but it should be understood that other types of coordinate systems may be used, such as cylindrical coordinate systems, spherical coordinate systems, etc. The in-service surface 212 includes damage features 222 that correspond to the physical damage features 210 of the in-service structure 200 of FIG. 2A.

Figure 2C:
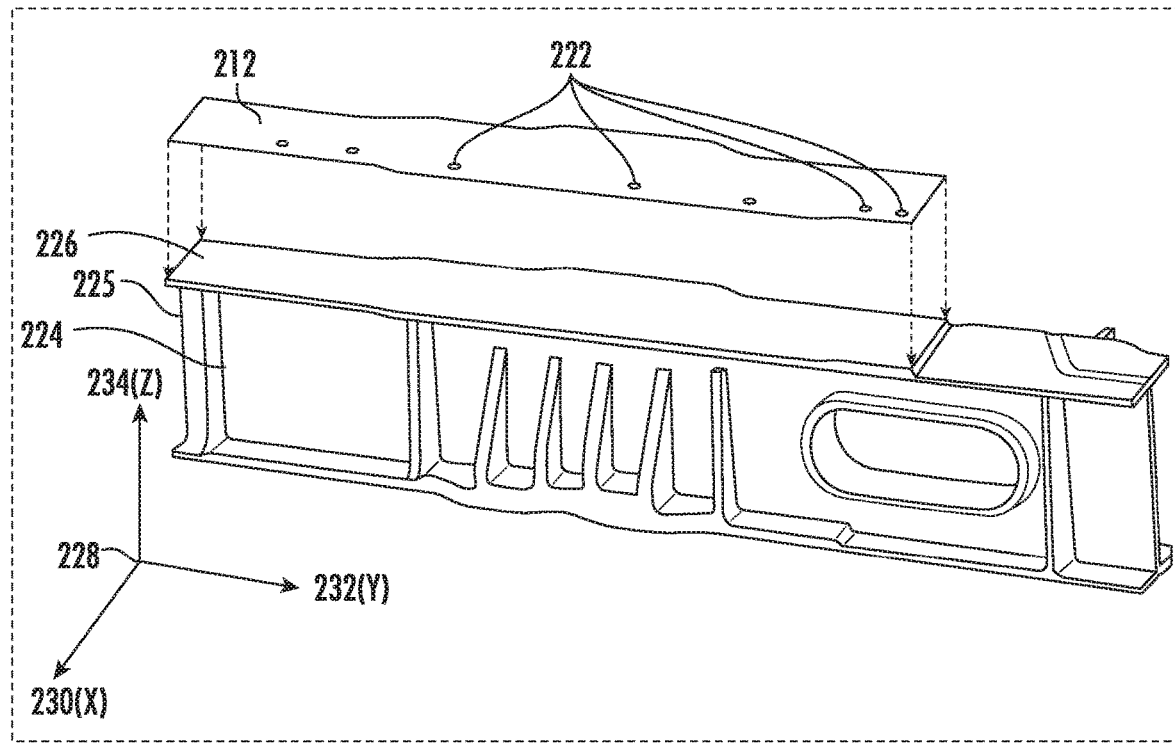
FIG. 2C illustrates modifying nominal CAD data by replacing a portion of the nominal surface with the in-service surface of FIG. 2B to generate a modified nominal volume, according to an embodiment.

Referring now to FIG. 2C a nominal volume 224 corresponding to a nominal structure 225 and having a nominal surface 226 corresponding to the in-service surface 212 is accessed. The nominal volume 224 is positioned and oriented in a CAD coordinate system 228 having depth (x) 230, length (y) 232, and height (z) 234 dimensions. The coordinates of the in-service surface 212 are transformed from the scanner coordinate system 214 to the CAD coordinate system 228 so that the in-service surface 212 is positioned and aligned with respect to the corresponding nominal surface 226 of the nominal volume 224.

Figure 2D:
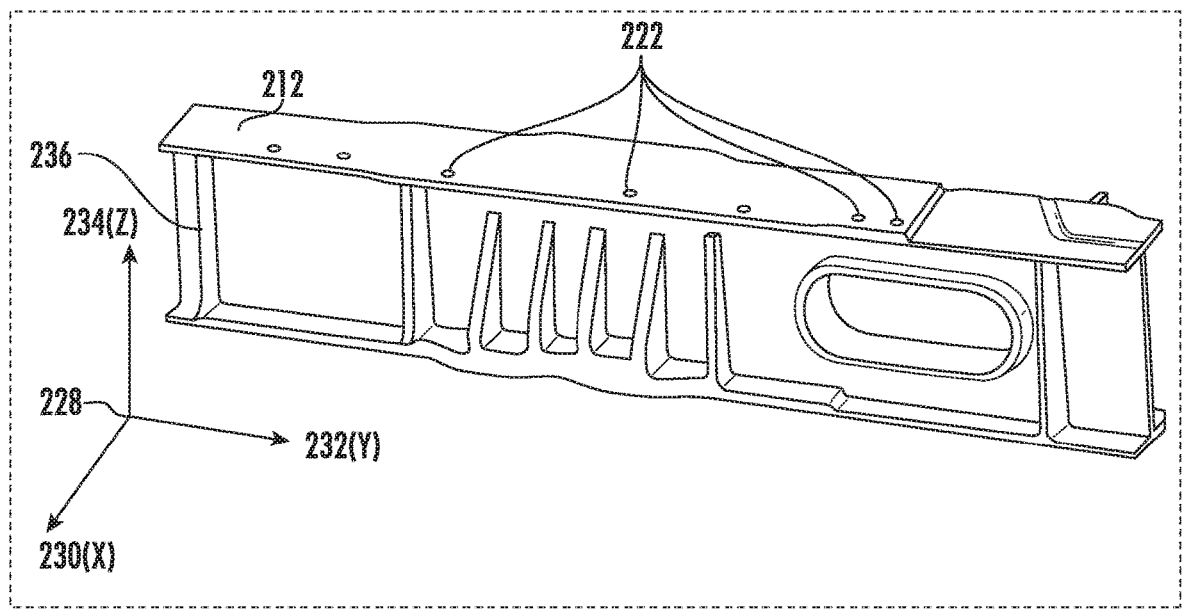
FIG. 2D illustrates modified nominal CAD data including the modified nominal volume modified in FIG. 2C.

Referring now to FIG. 2D, the in-service surface 212 replaces the nominal surface 226 of FIG. 2C to generate a modified nominal CAD volume 236. The replacing function in this example is by an operation similar to the operation 110', discussed above with respect to FIGS. 1A and 1B. It can be seen in FIG. 2D, the modified nominal CAD volume 236 generally corresponds to the nominal CAD volume (i.e., the representation of the original design or original condition of the in-service structure 200 of FIG. 2A). However, the modified nominal CAD volume 236 also includes the in-service surface 212, including the damage features 222 corresponding to the scanned physical damage features 210 of the in-service structure 200 of FIG. 2A.

Figure 3A:
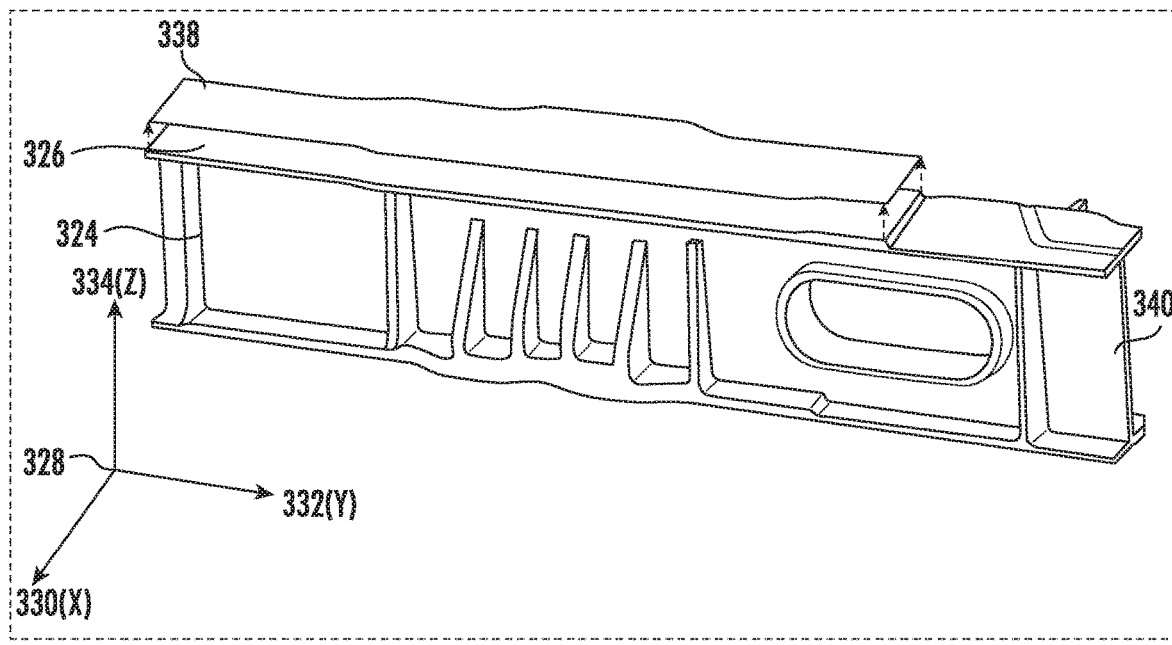
FIG. 3A illustrates raising a nominal surface with respect to a nominal volume similar to the nominal volume of FIG. 2C to generate an enlarged nominal volume, according to an alternative embodiment.
Figure 3B:
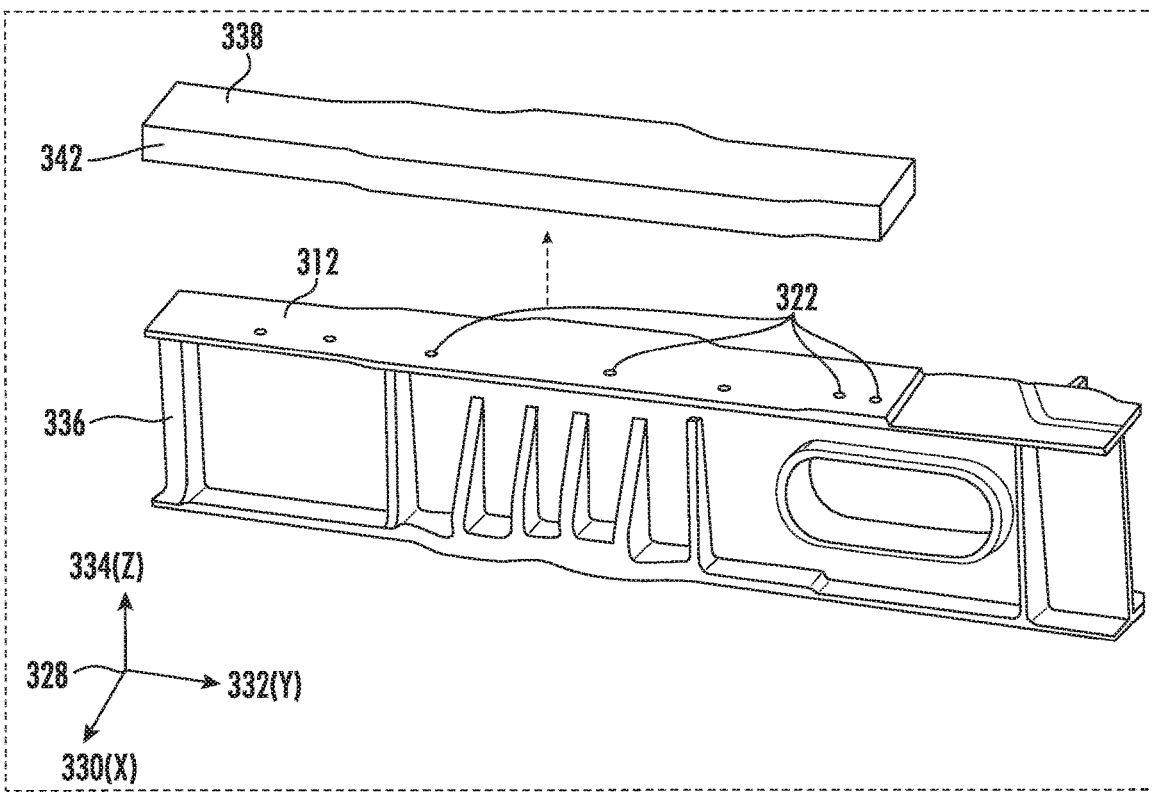
FIG. 3B illustrates removing a trim volume, defined by the raised nominal surface of FIG. 3A and the in-service surface, from the enlarged nominal volume to generate the modified nominal volume, according to an embodiment.

Referring now to FIGS. 3A and 3B, FIG. 3A illustrates an example of raising a nominal surface 326 with respect to a nominal volume 324 similar to the nominal volume 224 of FIG. 2C to generate an enlarged nominal volume 340, according to an alternative embodiment. The nominal volume 324 is positioned and oriented in a CAD coordinate system 328 having depth (x) 330, length (y) 332, and height (z) 334 dimensions. In this example, the nominal surface 326 is moved in the height (z) 334 dimension to form a raised surface 338 for the enlarged nominal volume 340.

Referring now to FIG. 3B, a trim volume 342 is defined by the raised surface 338 of FIG. 3A and the in-service surface 312, which is similar to the in-service surface 212 of FIGS. 2A-2D. The trim volume 342 is removed from the enlarged nominal volume 340 to generate the modified nominal volume 336. The removal function in this example is by an operation similar to the operation 110", discussed above with respect to FIGS. 1A and 1C.

It is also desirable to compare the modified nominal volume to the original 3D scan data, to verify the accuracy or precision of the modified nominal volume, for example to confirm that the FEA strength analysis will produce a result that corresponds to at least one of the actual condition or serviceability of the in-service structure within predetermined tolerances. In this regard, FIGS. 4A and 4B illustrate comparing the 3D scan data to the in-service surface of a modified nominal volume and providing a graphical indication how the in-service surface of the modified nominal CAD data corresponds to or deviates from the in-service surface of the in-service structure.

Figure 4A:
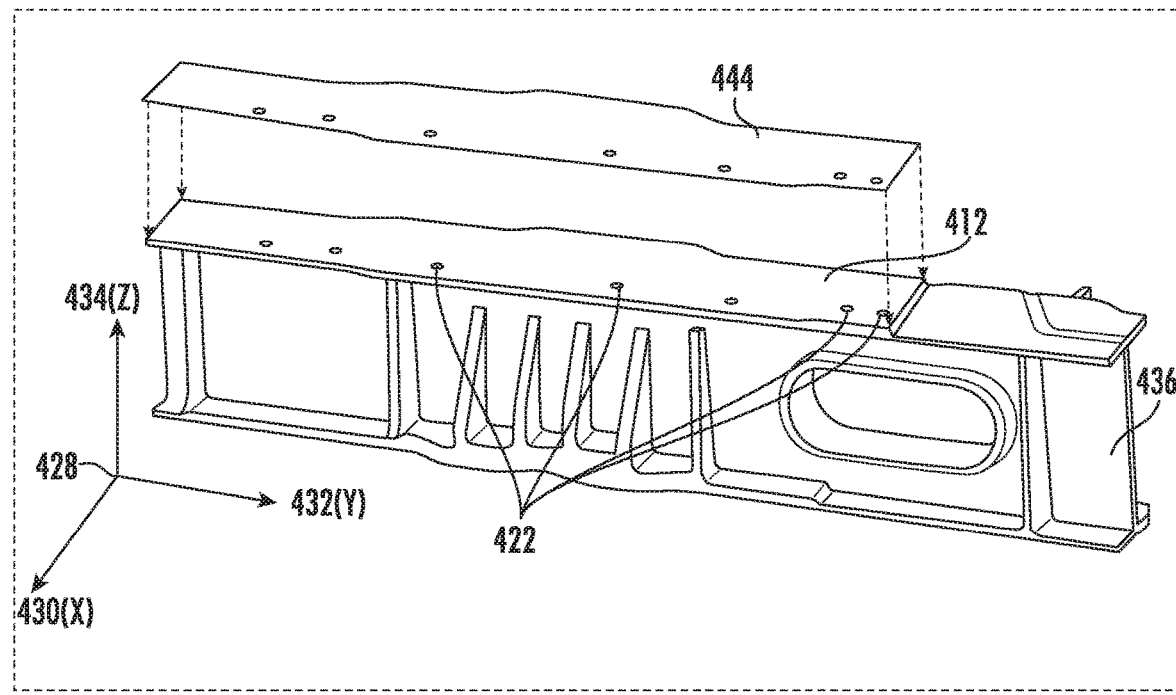
FIG. 4A illustrates comparing the 3D scan data to the in-service surface of a modified nominal volume similar to the modified nominal volume of FIG. 2D, according to an embodiment.

In FIG. 4A, the 3D scan data is transformed into a verification surface 444 within the CAD coordinate system 428 having depth (x) 430, length (y) 432, and height (z) 434 dimensions. The verification surface 444 is compared to the in-service surface 412 of the modified nominal volume 436, which includes damage features 422 corresponding to the measured in-service volume, thereby comparing the modified nominal volume 436 to the 3D scan data. In another embodiment, new 3D scan data may be captured, such as by the image capture device 202 of FIG. 2A, and transformed into the verification surface 444, so as to provide an independent comparison and verification of the accuracy or precision of the modified nominal volume 436, as well as the original 3D scan data. Based on the comparing, it is determined whether the in-service surface 412 of the modified nominal volume 436 corresponds to the in-service surface of the in-service structure, such as the in-service structure 200 of FIG. 2A in this example, within a predetermined tolerance.

Figure 4B:
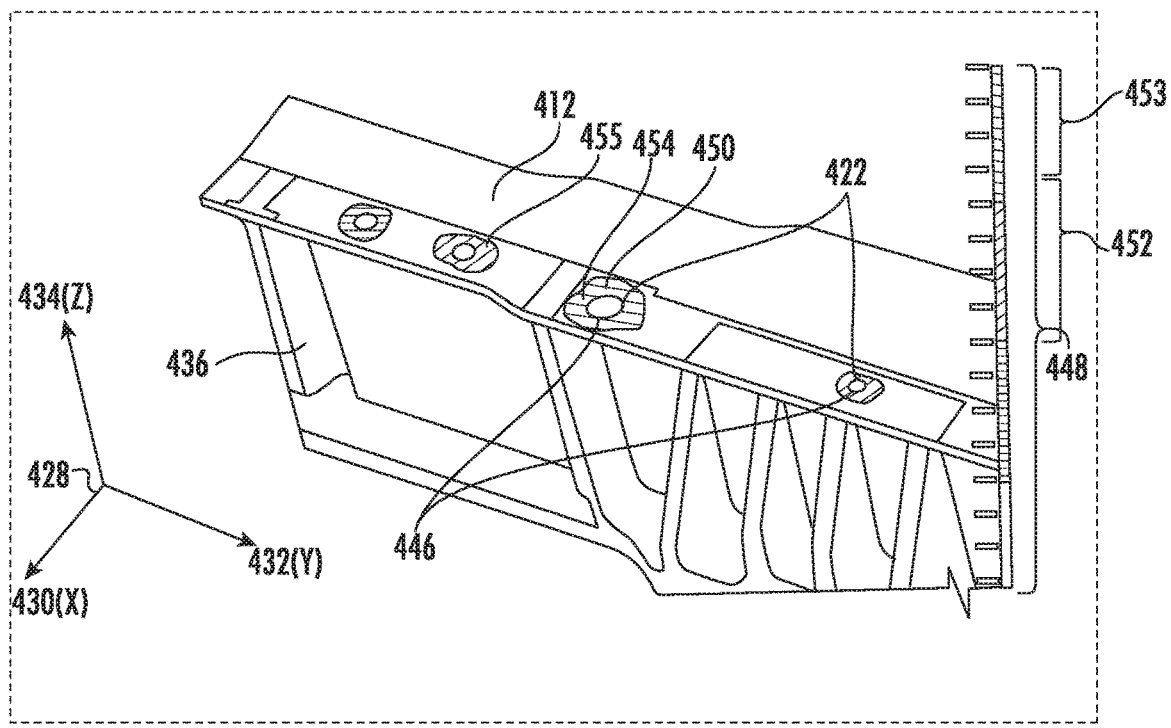
FIG. 4B illustrates a graphical indication how the in-service surface of the modified nominal CAD data corresponds to or deviates from the in-service surface of the in-service structure, based on the comparison.

Referring now to FIG. 4B, in response to the determining, an indication 446 is generated that indicates whether the in-service surface 412 of the modified nominal volume 436 corresponds to the in-service surface of the in-service structure within the predetermined tolerance. In this example, the indication 446 is a graphical indication that corresponds to a graphical scale 448. The graphical scale 448, which is color-coded or pattern coded in this example, illustrates different colors or patterns that correspond to different tolerances or tolerance ranges 452, 453. Portions of the in-service surface 412 that correspond to the 3D scan data within a particular tolerance or range of tolerances are indicated with the corresponding pattern or color, based on the graphical scale 448. For example, a particular portion 450 of the in-service surface 412 that is in an unacceptable tolerance range 453, i.e., outside a predetermined, acceptable tolerance or tolerance range 452, may be indicated with a high-contrast pattern 454, color, etc., different from a base pattern or color of the modified nominal volume 426, or from a pattern 455 or color associated win the acceptable tolerance range 452, to visually draw a viewer's attention to the portion 450 that deviates from the 3D scan data to an unacceptable degree. In this manner, the accuracy or precision of the modified nominal volume 436 may be verified, for example before or after the FEA analysis.

Figure 5:
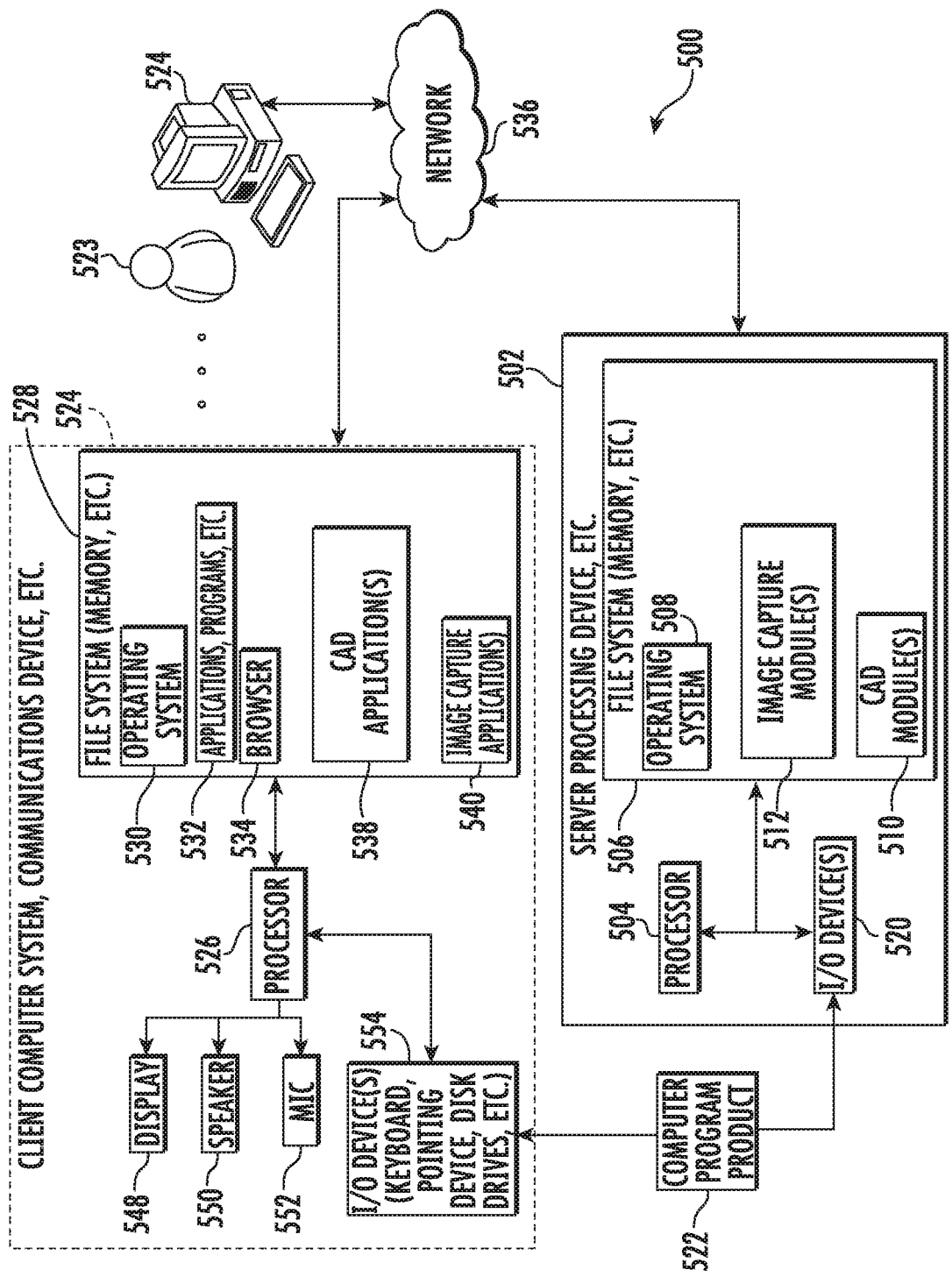
FIG. 5 illustrates a computing system for carrying out operations of any of the systems, devices, or methods disclosed herein, according to an embodiment.

FIG. 5 is a block schematic diagram of a computing system 500 for carrying out operations of any of the systems, devices, or methods disclosed herein, according to an embodiment. In accordance with an embodiment, the operations 100 of FIGS. 1A-1C are embodied in and performed by the system 500 and aspects of the embodiments described herein are performed, generated and presented by the system 500. The system 500 includes a processor device 502. In accordance with an example, the processor device 502 is a server or similar processor circuit. The processor device 502 includes a processor circuit 504 for controlling operation of the processor device 502 and for performing functions, such as those described herein with respect to operations 100 in FIGS. 1A-1C. The processor device 502 also includes a memory 506, e.g., a file system. An operating system 508, applications and other programs are stored on the memory 506 for running or operating on the processor circuit 504. One or more CAD modules 510 or systems are also stored on the memory 506 and are compiled and run on the processor circuit 504 to perform the functions or operations described herein. The CAD module 510 is any type of software hardware or combination of hardware and software for performing 3D data processing, transformation, CAD operations, or other features described herein.

An image capture module 512 is also stored on the memory 506. The operations 100 of FIGS. 1A-1C, such as capturing the 3D scan data, for example, are embodied in the image capture module 512 and performed by the processor circuit 504 when the image capture module 512 2 is compiled and run on the processor circuit 504. The image capture module 512 is operate in conjunction with the CAD module 510. In accordance with an embodiment, the image capture module 512 is a separate component from the CAD module 510. In another embodiment, the image capture module 512 is a component of the CAD module 510.

The processor device 502 also includes one or more input devices, output devices or combination input/output devices, collectively I/O devices 520. The I/O devices 520 include, but are not necessarily limited to, a keyboard or keypad, pointing device, such as a mouse, disk drive and any other devices to permit a user to interface with and control operation of the processor device 502 and to access the CAD module 510 or system and the image capture module 512. In accordance with an embodiment, at least one of the I/O devices 520 is a device to read a computer program product, such as computer program product 522. The computer program product 522 is similar to that described in more detail herein. The CAD module 510 and the image capture module 512 are loaded on the memory 506 from a computer program product, such as computer program product 522.

A member of a network or user 523 of the system 500 may use a computer system 524 or communications device to access the processor device 502 or server and CAD module 510 and image capture module 512. The computer system 524 or communications device is any sort of communications device including a mobile or handheld computer or communications device. The computer system 524 includes a processor 526 to control operation of the computer system 524 and a memory 528, e.g., a file system, or similar data storage device. An operating system 530, applications 532 and other programs are stored on the memory 528 for running or operating on the processor 526. A web or Internet browser 534 is also stored on the memory 528 for accessing the processor device 502 or server via a network 536. The network 536 may be the Internet, an intranet or other private or proprietary network.

A CAD application 538 is also stored on the memory 528. In accordance with an embodiment, the operations 100 in FIGS. 1A-1C are embodied in and performed by the CAD application 538. The CAD application 538 is compiled and run on the processor 526 to perform functions similar to those described with respect to operations 100, for example.

One or more image capture applications 540 are also stored on the memory 528, e.g., a file system. The one or more image capture applications 540 are any type of software application for performing 3D data processing, transformation, CAD operations, or other features described herein. In accordance with an embodiment, the CAD application 538 is a separate component from the image capture application 540 as shown in the embodiment in FIG. 5. In another embodiment, the image capture application 540 is a component of the CAD application 538.

The CAD application 538 and the image capture application 540 operating on the computer system 524 interface with or operate in conjunction with the CAD module 510 and the image capture module 512 on the processor device 502 or server to perform the functions and operations described herein. Accordingly, the CAD application 538 and the image capture application 540 operating on the computer system 524 perform some of the functions and operations of the operations 100 of FIGS. 1A-1C, and the CAD module 510 or image capture module 512 operating on the processor device 502 or server perform other functions of the operations 100 of FIGS. 1A-1C. Some embodiments include only the CAD module 510 and image capture module 512 on the processor device 502 or server, and other embodiments include only the CAD module 510 and image capture module 512 operating on the client computer system 524 or communications device.

In accordance with an embodiment, the client computer system 524 or communications device also includes a display 548, a speaker system 550, and a microphone 552 for voice communications. Commands are presented on the display 548 for controlling operation of the CAD module 510 and image capture module 512 or the CAD application 538 and the image capture application 540, and for performing the operations and functions described herein. In accordance with an example, a graphical user interface (GUI) is presented on the display 548 to display aspects of the embodiments above.

In accordance with an embodiment, the computer system 524 also includes one or more input devices, output devices or combination input/output devices, collectively I/O devices 554. Examples of the I/O devices 554 include, but are not necessarily limited to, a keyboard or keypad, pointing device, such as a mouse, disk drives and any other devices to permit a user, such as user 523, to interface with and control operation of the computer system 524 and to access components of the system 500. The I/O devices 554 also include an image capture device, such as the image capture device 202 of FIG. 2A, or a device configured to read computer code from a computer program product, such as computer program product 522.

As will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, microcode, etc.) or combining software and hardware implementation that may all generally be referred to herein as a "circuit," "module," "component," or "system." Furthermore, aspects of the present disclosure may take the form of a computer program product embodied in one or more computer readable media having computer readable program code embodied thereon.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations or block diagrams of methods, apparatuses (systems) and computer program products according to embodiments of the disclosure. It will be understood that each block of the flowchart illustrations or block diagrams, and combinations of blocks in the flowchart illustrations or block diagrams, can be implemented by machine-readable instructions, e.g., computer program instructions. These machine-readable instructions may be provided to a processor of a general-purpose computer, special purpose computer, or other programmable data processing apparatus to produce a machine, such that the instructions, which execute via the processor of the computer or other programmable instruction execution apparatus, create a mechanism for implementing the functions or acts specified in the flowchart or block diagram block or blocks.

These machine-readable instructions may also be stored in a transitory or non-transitory computer readable medium that when executed can direct a computer, other programmable data processing apparatus, or other devices to function in a particular manner, such that the instructions when stored in the computer readable medium produce an article of manufacture including instructions which when executed, cause a computer to implement the function or act specified in the flowchart or block diagram block or blocks. The machine-readable instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions or acts specified in the flowchart or block diagram block or blocks. The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of code, which includes one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams or flowchart illustration, and combinations of blocks in the block diagrams or flowchart illustration, can be implemented by special purpose hardware-based systems that perform the specified functions or acts, or combinations of special purpose hardware and computer instructions.

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises" and "comprising," when used in this specification, specify the presence of stated features, steps, operations, elements, or components, but do not preclude the presence or addition of one or more other features, steps, operations, elements, components, or groups thereof. As used herein, the term "and/or" includes any and all combinations of one or more of the associated listed items and may be designated as "/". Like reference numbers signify like elements throughout the description of the figures.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way or combination, and the present specification, including the drawings, shall be construed to constitute a complete written description of all combinations and subcombinations of the embodiments described herein, and of the manner and process of making and using them, and shall support claims to any such combination or subcombination.

The invention claimed is:

1. A system for determining serviceability and remaining life of an in-service structure comprising:
   a processor circuit; and
   a memory coupled to the processor circuit, the memory comprising machine-readable instructions that, when executed by the processor circuit:
      access three-dimensional (3D) scan data captured by a scanning device representative of an in-service structure;
      based on the 3D scan data, generate in-service computer-aided design (CAD) data representative of an in-service volume comprising an in-service surface corresponding to the in-service structure;
      access nominal CAD data representative of a nominal volume comprising a nominal surface, wherein the nominal volume corresponds to a nominal structure, and wherein a portion of the nominal surface corresponds to the in-service surface; and
      replace the portion of the nominal surface with the in-service surface to generate modified nominal CAD data representative of a modified nominal volume comprising the in-service surface;
      compare the modified nominal volume of the modified nominal CAD data to the in-service volume generated from the 3D scan data;
      determine, based on the comparison, whether the modified nominal volume of the modified nominal CAD data corresponds to the in-service volume of the in-service structure within a predetermined tolerance;
      in response to determining that the modified nominal volume corresponds to the in-service volume within the predetermined tolerance, determine at least one of a serviceability level or remaining life estimate of the in-service structure based on the modified nominal CAD data; and
      display an indication of the at least one of the serviceability level or remaining life estimate of the in-service structure.

2. The system of claim 1, wherein replacing the portion of the nominal surface further comprises removing a trim volume at least partially defined by the portion of the nominal surface and the in-service surface from the nominal volume.

3. The system of claim 1, wherein replacing the portion of the nominal surface further comprises adding an additive volume at least partially defined by the portion of the nominal surface and the in-service surface to the nominal volume.

4. The system of claim 1, wherein replacing the portion of the nominal surface further comprises:
   raising the nominal surface with respect to the nominal volume to generate an enlarged nominal volume; and
   removing a trim volume at least partially defined by the raised nominal surface and the in-service surface from the enlarged nominal volume.

5. The system of claim 1, wherein the machine-readable instructions further cause the processor circuit to:
   access second 3D scan data captured by the scanning device representative of the in-service structure;
   compare the in-service surface of the modified nominal CAD data to the second 3D scan data; and
   determine, based on the comparing, whether the in-service surface of the modified nominal CAD data corresponds to the in-service surface of the in-service structure within a predetermined tolerance; and
   generate, in response to the determining, an indication of whether the in-service surface of the modified nominal CAD data corresponds to the in-service surface of the in-service structure within the predetermined tolerance.

6. The system of claim 1, wherein the 3D scan data comprises a 3D mesh data structure, and wherein generating the in-service CAD data further comprises converting the 3D mesh data structure into an in-service CAD data structure comprising the in-service surface.

7. The system of claim 1, wherein the machine-readable instructions further cause the processor circuit to:
   perform strength analysis on the modified nominal CAD data to determine a condition of the in-service structure, wherein determining the at least one of the serviceability level or remaining life estimate of the in-service structure is further based on the strength analysis.

8. The system of claim 7, wherein performing strength analysis comprises performing finite element analysis on the modified nominal volume to determine the condition of the in-service structure.

9. The system of claim 1, wherein the in-service structure comprises an in-service vehicle structure.

10. The system of claim 9, wherein the in-service vehicle structure comprises an in-service aircraft structure.

11. A method for determining serviceability and remaining life of an in-service structure comprising:
   accessing, by a processor circuit, three-dimensional (3D) scan data captured by a scanning device representative of an in-service volume comprising an in-service surface corresponding to an in-service structure;
   based on the 3D scan data, generating, by the processor circuit, in-service computer-aided design (CAD) data representative of an in-service surface corresponding to the in-service structure;
   accessing nominal CAD data representative of a nominal volume comprising a nominal surface, wherein the nominal volume corresponds to a nominal structure, and wherein a portion of the nominal surface corresponds to the in-service surface; and
   replacing the portion of the nominal surface with the in-service surface to generate modified nominal CAD data representative of a modified nominal volume comprising the in-service surface;
   comparing the modified nominal volume of the modified nominal CAD data to the in-service volume generated from the 3D scan data;
   determining, based on the comparing, whether the modified nominal volume of the modified nominal CAD data corresponds to the in-service volume of the in-service structure within a predetermined tolerance; and
   in response to determining that the modified nominal volume corresponds to the in-service volume within the predetermined tolerance, determining at least one of a serviceability level or remaining life estimate of the in-service structure based on the in-service CAD data representative of the in-service surface and the modified nominal CAD data; and
   displaying an indication of the at least one of the serviceability level or remaining life estimate of the in-service structure.

12. The method of claim 11, wherein replacing the portion of the nominal surface further comprises removing a trim volume at least partially defined by the portion of the nominal surface and the in-service surface from the nominal volume.

13. The method of claim 11, wherein replacing the portion of the nominal surface further comprises adding an additive volume at least partially defined by the portion of the nominal surface and the in-service surface to the nominal volume.

14. The method of claim 11, wherein replacing the portion of the nominal surface further comprises:
raising the nominal surface with respect to the nominal volume to generate an enlarged nominal volume; and
removing a trim volume at least partially defined by the raised nominal surface and the in-service surface from the enlarged nominal volume.

15. The method of claim 11, further comprising performing strength analysis on the modified nominal CAD data.

16. A system for determining serviceability and remaining life of an in-service structure comprising:
a processor circuit; and
a memory coupled to the processor circuit, the memory comprising machine-readable instructions that, when executed by the processor circuit:
access nominal computer-aided design (CAD) data representative of a nominal volume comprising a nominal surface, wherein the nominal volume corresponds to a nominal structure;
access three-dimensional (3D) scan data captured by a scanning device representative of an in-service structure corresponding to the nominal structure;
based on the 3D scan data, generate in-service CAD data representative of an in-service surface of the in-service structure corresponding to a portion of the nominal surface;
replace the portion of the nominal surface with the in-service surface to generate modified nominal CAD data representative of a modified nominal volume comprising the in-service surface;
perform strength analysis on the modified nominal CAD data to determine a condition of the in-service structure, wherein determining the at least one of the serviceability level or remaining life estimate of the in-service structure is further based on the strength analysis; and
display an indication of at least one of the serviceability level or remaining life estimate of the in-service structure based on the performance of the strength analysis.

17. The system of claim 16, wherein replacing the portion of the nominal surface further comprises removing a trim volume at least partially defined by the portion of the nominal surface and the in-service surface from the nominal volume.

18. The system of claim 16, wherein replacing the portion of the nominal surface further comprises adding an additive volume at least partially defined by the portion of the nominal surface and the in-service surface to the nominal volume.

19. The system of claim 16, wherein performing strength analysis comprises performing finite element analysis on the modified nominal volume to determine the condition of the in-service structure.

20. The method of claim 15, wherein performing strength analysis comprises performing finite element analysis on the modified nominal volume to determine the condition of the in-service structure.

* * * * *